United States Patent [19]

Iso et al.

[11] 4,403,347
[45] Sep. 6, 1983

[54] ANTENNA TUNING CIRCUIT FOR AM RADIO RECEIVER

[75] Inventors: Yoshimi Iso; Eijiro Oshitani, both of Toyokawa; Shin-ichi Ohashi, Chigasaki; Shigeki Inoue, Toyokawa, all of Japan

[73] Assignee: Hitachi, Ltd., Tokyo, Japan

[21] Appl. No.: 232,005

[22] Filed: Feb. 6, 1981

[30] Foreign Application Priority Data

Feb. 8, 1980 [JP]  Japan .................................. 55/13719

[51] Int. Cl.³ .............................................. H04B 1/18
[52] U.S. Cl. .................................... 455/193; 455/286; 343/728; 343/788
[58] Field of Search ....................... 455/193, 283, 286; 343/701, 702, 788, 728

[56] References Cited

U.S. PATENT DOCUMENTS

| | | | |
|---|---|---|---|
| 3,078,348 | 2/1963 | McIntosh | 343/788 |
| 3,570,005 | 3/1971 | Rrolss | 455/193 |
| 3,827,053 | 7/1974 | Willie et al. | 343/701 |
| 4,052,674 | 10/1977 | Miyamoto | 455/193 |
| 4,263,676 | 4/1981 | Liebel | 455/286 |

*Primary Examiner*—Eli Lieberman
*Attorney, Agent, or Firm*—Antonelli, Terry & Wands

[57] ABSTRACT

An improved antenna tuning circuit for a long and a medium wave AM radio receiver is disclosed. The antenna tuning circuit of the present invention comprises a tuning coil wound around a ferrite core, a variable capacitor connected in parallel with the tuning coil, and a field effect transistor. One end of the tuning coil is connected to the gate electrode directly or through an impedance means, while the other end of the tuning coil is grounded. The output signal of the antenna tuning circuit is taken out from a selected one of the source or drain electrode of the field effect transistor, whereby the signal to noise ratio may be remarkably improved.

4 Claims, 6 Drawing Figures

FIG. 1 PRIOR ART
FIG. 3
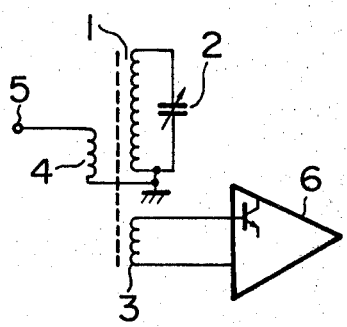
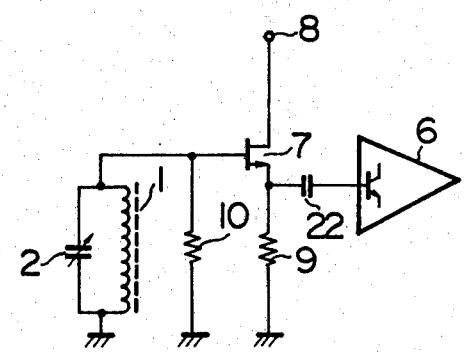
FIG. 4
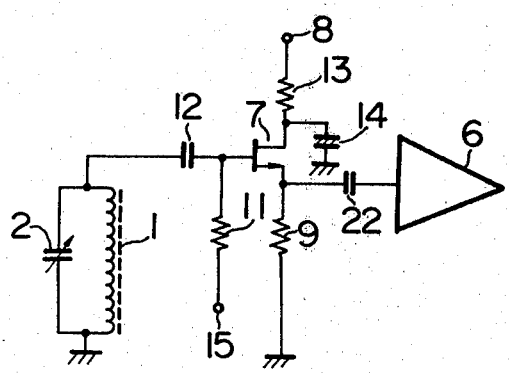
FIG. 6
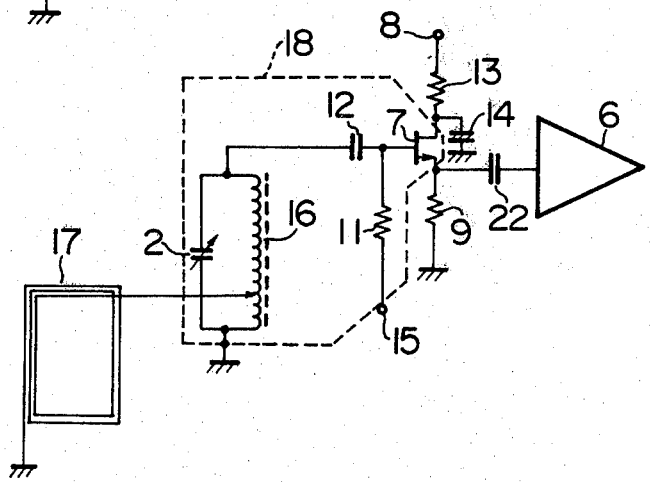

4,403,347

ANTENNA TUNING CIRCUIT FOR AM RADIO RECEIVER

BACKGROUND OF THE INVENTION

1. Field of the Invention

The present invention relates to an antenna tuning circuit for an AM radio receiver, and more particularly, to an antenna tuning circuit for long and medium wave AM radio receivers.

2. Description of the Prior Art

A conventional antenna tuning circuit for an AM radio receiver is provided with a parallel connection of an antenna coil wound around a ferrite core and a variable capacitor. A tuned output signal from the tuning circuit is applied to a first stage transistor through a secondary coil. In such a construction, it has been found that the secondary coil acts as an antenna for signals short wave, and, therefore, the antenna tuning circuit undergoes interference from the short wave signal.

The ferrite antenna is usually mounted on the outside of a chassis, so that a signal from a hot or energized side terminal of the antenna tuning circuit must be fed into the circuit board in the chassis by a lead wire. The path of the lead wire for leading the signal into the circuit board can catch external noise since the impedance of the tuning circuit is extremely high at its tuning frequency. This fact leads to an extreme deterioration of the signal to noise ratio of the receiver.

Accordingly, an object of the invention is to provide an improved antenna tuning circuit which may overcome the foregoing disadvantages of the conventional antenna tuning circuit.

In order to achieve the above object, the present invention employs a field effect transistor which is free from current noise in principle and which has a high input impedance in such a way that the hot side of an antenna coil is directly connected with the gate electrode of a field effect transistor (hereinafter merely referred to as FET) connected in a source-follower circuit configuration. With this circuit arrangement, the secondary coil becomes unnecessary for the antenna tuning circuit, so that the problem of the current noise of the bipolar transistor as well as the adverse effect of the short wave signal received by the secondary coil may be solved.

BRIEF DESCRIPTION OF THE DRAWING

FIG. 1 shows a circuit diagram of a conventional antenna tuning circuit.

FIG. 3 shows a circuit diagram of a first embodiment of an antenna tuning circuit for an AM radio receiver according to the present invention.

FIG. 4 shows a circuit diagram of a second embodiment of an antenna tuning circuit for an AM radio receiver according to the present invention.

FIG. 6 shows a circuit diagram of a third embodiment of an antenna tuning circuit for an AM radio receiver according to the present invention.

DESCRIPTION OF THE PREFERRED EMBODIMENTS

Figure 5:
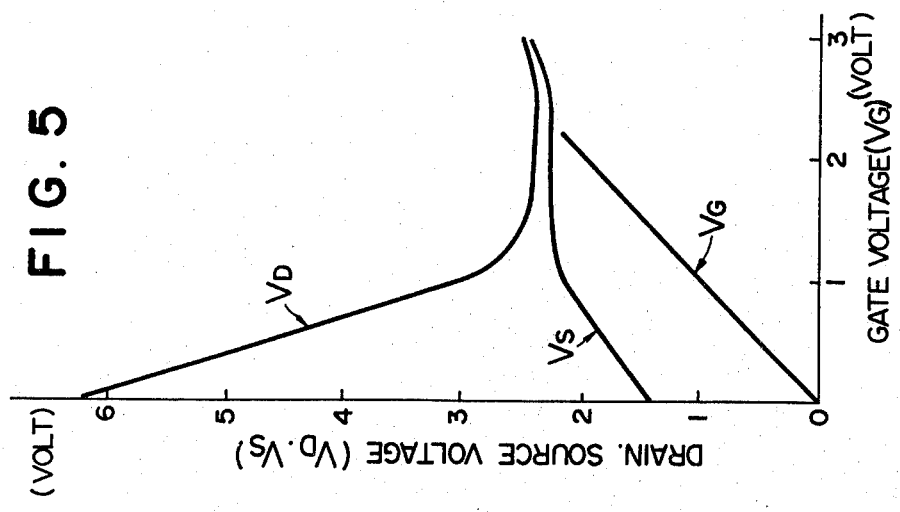
FIG. 5 shows a graphical representation of a forward AGC characteristic of an FET.

For better understanding of the present invention, the conventional antenna tuning circuit will be described in detail below before the explanation of the embodiments of the present invention, with reference to FIG. 1.

Referring to FIG. 1, reference numeral 1 designates an antenna coil wound around a ferrite bar core, 2 a variable capacitor, 3 a secondary coil magnetically coupled with the antenna coil 1 at a turn ratio of about 1/10, 4 a ternary coil magnetically coupled with the antenna coil 1, and 5 an external antenna terminal for inducing a voltage in the ternary coil 4. The external antenna terminal 5 is kept open in normal use and adapted to catch a radio wave with a frequency tuned by the ferrite bar antenna 1 and a voltage induced in the secondary coil 3 is applied to the base of a transistor in a radio frequency amplifier 6 or a frequency converter. The reason why a received signal is picked up from the secondary coil with the reduced number of turns, is as follows: The first reason is that an impedance apparently connected in parallel with the antenna tuning circuit must be made large in order to increase a Q factor of the antenna tuning circuit. However, the input impedance of the input transistor of the amplifier 6 is low. Therefore, the secondary coil increases the impedance. The second reason is that the signal source impedance of the transistor must be decreased in order to lessen the adverse effect of the current noise of the input transistor of the amplifier 6 and simultaneously assure the necessary sensitivity.

Figure 2:
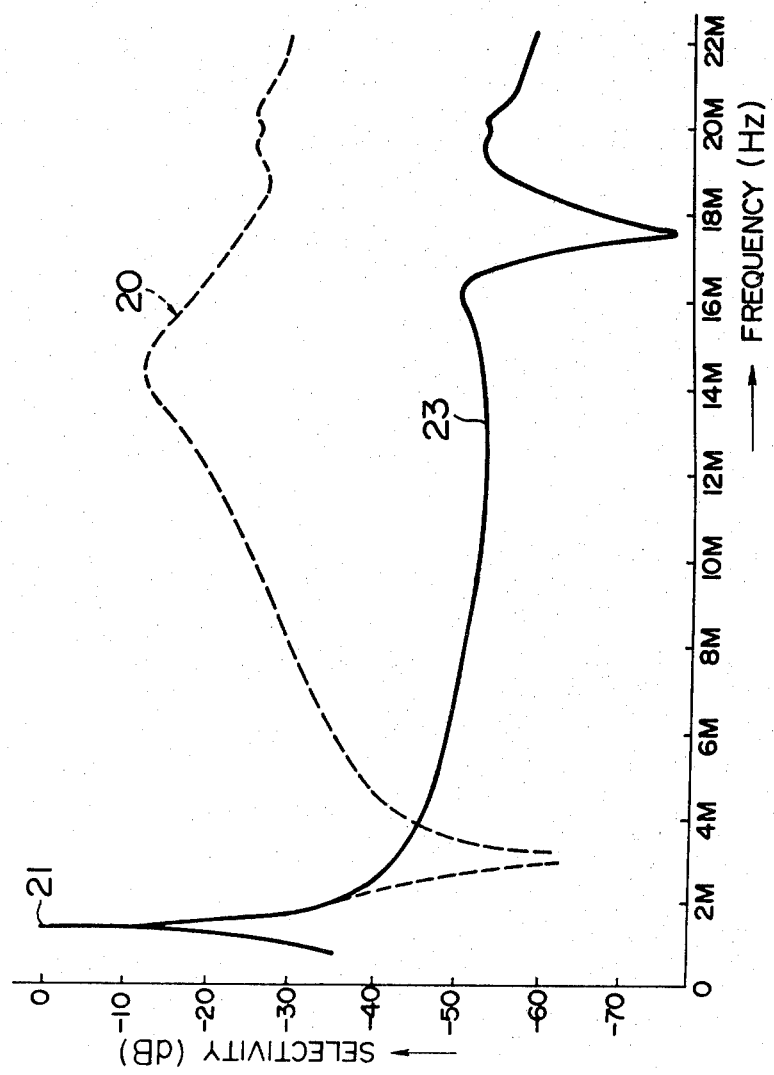
FIG. 2 shows a graphical representation of a selectivity characteristic in high frequencies of the antenna tuning circuit.

In the antenna tuning circuit as mentioned above, the impedance of the capacitor 2 becomes almost zero at high frequencies (short wave), so that no voltage is induced in the antenna tuning circuit. As the received frequencies become high, the change of an alternate magnetic flux will be increased in the ferrite bar antenna, and therefore the secondary coil will act as antenna coil. As a result, the induced voltage in the secondary coil increases so as to deteriorate the selectivity characteristics in the high frequencies. For example, the selectivity characteristic is shown by a broken line 20 in FIG. 2, where the antenna tuning circuit is tuned for a medium wave (the tuning point is shown by 21).

The selectivity at high frequencies (short wave) is deteriorated down to −15 dB at the worst with respect to the turning point. As a result, the short wave signal is beat down with a higher harmonic of the local oscillator frequency to an IF frequency which becomes an interference signal.

The sensitivity of the receiver is limited by an equivalent input noise of the input transistor in the amplifier 6. For that reason, in order to increase sensitivity of the antenna tuning circuit, the input signal level of the amplifier 6 must be increased by elongating the effective length of the antenna or the equivalent input noise must be reduced by improving the input transistor device of the amplifier 6.

Therefore, the present invention does not employ the method of taking out a signal from the secondary coil which causes the deterioration of the selectivity of the antenna tuning circuit at high frequencies.

According to the present invention, a signal induced in the tuning coil is fed into an FET with a high input impedance and free from current noise. Further, a forward AGC voltage is applied to the FET in order to prevent the high frequency amplifier or the frequency converter from causing saturation due to too large an input signal.

FIG. 3 shows a circuit diagram of a first embodiment of an antenna tuning circuit according to the present invention. Referring to FIG. 3, an FET 7 is connected in a source-follower circuit configuration. The drain electrode of the FET 7 is connected to a power source terminal 8, and the source electrode is connected through a resistor 9 to ground. The output signal is taken out from the source electrode. The source electrode of the FET 7 is connected through a capacitor 22 to an input of a high frequency amplifier 6. A quality factor Q of an antenna turning circuit coil 1 and a capacitor 2 is limited by a resistor 10 connected between the gate electrode of the FET 7 and ground. Since the antenna tuning circuit of FIG. 3 does not use the secondary coil which was used in the conventional circuit, the selectivity in higher frequencies is not deteriorated. On the contrary, it is improved by 40 dB at maximum as compared with that of the conventional tuning circuit. In this respect, the short wave interference can be eliminated. The voltage signal applied to the gate electrode of the FET 7 is by about 20 dB larger than that applied to the amplifier 6 of FIG. 1 since there is no turn reduction of the secondary coil. The equivalent input noise voltage of the FET is substantially equal to that of the bipolar transistor, however, the equivalent input noise current of the FET is remarkably smaller than that of the bipolar transistor. The noise source to limit the sensitivity is not the FET 7 but the resistor 10 for producing thermal noise. In the conventional antenna tuning circuit, the equivalent input noise current of the input transistor of the amplifier 6 of FIG. 1 is larger than the thermal noise of the resistor to limit the Q factor of the antenna tuning circuit, so that the sensitivity is predominantly determined by the noise of the transistor. On the other hand, in the antenna tuning circuit of the present invention, the sensitivity is determined by the resistor to limit the Q factor of the antenna turning circuit. Therefore, the practical sensitivity of the present invention can be increased by 3 to 7 dB as compared with the conventional one.

In the circuit of FIG. 3, since the output signal from the source electrode of the FET 7 is larger by about 20 dB than the conventional one, the high frequency amplifier and the frequency converter which are connected at the succeeding stage, are likely to be saturated. Actually, an antenna input signal voltage varies over a wide range of 10 μV to 10 V. Therefore, there is such a disadvantage that distortion is increased at a strong input signal. In order to prevent such disadvantage, it is necessary to apply an automatic gain control (AGC) for the FET 7.

FIG. 4 shows a second embodiment of an antenna tuning circuit according to the present invention for which a forward AGC may be applied with a simple circuit arrangement.

Referring to FIG. 4, reference numeral 13 designates a drain resistor, 14 a bypass capacitor, 12 a capacitor for blocking DC bias voltage, and 11 a resistor for providing a gate bias voltage to the FET 7 and simultaneously determining the Q factor of an antenna tuning circuit including a coil 1 and a capacitor 2. When the FET 7 is connected to the drain resistors 13, the source resistor 9, the gate bias resistor 11 and the drain signal bypass capacitor 14, as shown in FIG. 5, a quiescent characteristic of a gate-source voltage to a drain voltage is as shown in FIG. 5.

When a positive voltage formed by smoothing the AM detected signal is applied to an AGC terminal 15, the gate voltage of the FET rises and the drain current increases. In this case, because of the presence of the drain resistor, the drain the voltage drops, so that voltage between the drain and source electrodes becomes small and the gm becomes also small. As a result, the AGC has an effect on the output signal produced from the source electrode.

FIG. 6 is a third embodiment of an antenna tuning circuit according to the present invention. A coil 16 with a tap having an inductance substantially equal to that of the ferrite core antenna cooperates with a variable capacitor 2 to form a tuning circuit. The tap of the coil 16 is connected to an external antenna for catching radio wave such as a loop antenna. Since the impedance of the external antenna 17 is low, it is difficult for external noise to be induced into a wire extending from the antenna 17 to the tap of the tuning coil 16. Further, a pot core is used for the tuning coil 16 to magnetically shield it from external noise and a shield case 18 is used for the tuning circuit to electrically shield it from external noise. Therefore, the circuit arrangement of the present embodiment may attain effects comparable with that of FIG. 2 as indicated by a solid line 23 with respect to the short wave interference and the practical sensitivity.

According to the present invention, the short wave interference of the conventional problem in the medium wave AM receiver may be improved by 40 dB at maximum, and, in the practical use, a great improvement of the receiver performance may be realized. Furthermore, the practical sensitivity may be improved by 3 to 7 dB as compared with the conventional antenna tuning circuit. The additional use of the simple AGC may attain the useful effects without increase of cost of manufacture and any problem of an overly strong input signal.

We claim:

1. An antenna tuning circuit for a long wave and a medium wave AM radio receiver comprising:
   a tuning resonator having a tuning coil wound around a ferrite core to have an antenna function and a variable capacitor connected in parallel with said tuning coil, the output from said tuning reasonator being coupled to a high frequency amplifier;
   a source follower field effect transistor (FET), one end of said tuning coil being connected to the gate electrode of said FET, the other end of said tuning coil being grounded, and an output signal of said antenna tuning circuit being taken out from the source electrode of said FET;
   a first resistor connected between the drain electrode of said FET and an external power source;
   a second resistor connected between the source electrode of said FET and ground; and
   a bypass capacitor connected between the drain electrode of said FET and ground, wherein
   a forward AGC voltage is supplied to the gate electrode of said FET.

2. An antenna tuning circuit according to claim 1, wherein said FET and said tuning coil are magnetically shielded.

3. An antenna tuning circuit for a long wave and a medium wave AM radio receiver comprising:
   a tuning resonator having a tuning coil wound around a ferrite core to have an antenna function and a variable capacitor connected in parallel with said tuning coil, the output from said tuning resonator being coupled to a high frequency amplifier;

a source follower field effect transistor (FET), one end of said tuning coil being connected to the gate electrode of said FET, the other end of said tuning coil being grounded, and an output signal of said antenna tuning circuit being taken out from the source electrode of said FET;

a first resistor connected between the drain electrode of said FET and an external power source;

a second resistor connected between the source electrode of said FET and ground;

a bypass capacitor connected btween the drain electrode of said FET and ground;

an external loop antenna connected to said tuning coil;

a couping capacitor connected between a hot side of said tuning coil and the gate electrode of said FET; and a third resistor connected to the gate electrode, wherein a forward AGC voltage is supplied to the gate electrode of said FET through said third resistor.

4. An antenna tuning circuit according to claim 3, wherein said tuning coil, said variable capacitor, said FET, said coupling capacitor and said third resistor are electrically shielded.

* * * * *